(12) United States Patent
Sukegawa et al.

(10) Patent No.: US 10,068,811 B2
(45) Date of Patent: Sep. 4, 2018

(54) METHOD OF EVALUATING GETTERING PROPERTY

(71) Applicant: DISCO CORPORATION, Tokyo (JP)

(72) Inventors: Naoya Sukegawa, Tokyo (JP); Ryohei Yokota, Tokyo (JP); Naruto Fuwa, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/594,073

(22) Filed: May 12, 2017

(65) Prior Publication Data

US 2017/0338158 A1    Nov. 23, 2017

(30) Foreign Application Priority Data

May 19, 2016   (JP) ................................ 2016-100288

(51) Int. Cl.
| | | |
|---|---|---|
| *H01L 23/544* | (2006.01) | |
| *H01L 21/66* | (2006.01) | |
| *H01L 21/02* | (2006.01) | |

(52) U.S. Cl.
CPC ........ *H01L 22/12* (2013.01); *H01L 21/02016* (2013.01); *H01L 21/02024* (2013.01); *H01L 23/544* (2013.01)

(58) Field of Classification Search
None
See application file for complete search history.

(56) References Cited

U.S. PATENT DOCUMENTS

| 7,108,591 | B1 * | 9/2006 | Boyd | ..................... B24B 37/30 |
|---|---|---|---|---|
| | | | | 451/285 |
| 2012/0289060 | A1 * | 11/2012 | Harada | ................. H01L 21/304 |
| | | | | 438/759 |
| 2016/0136779 | A1 * | 5/2016 | Kashiwada | .............. B24D 3/28 |
| | | | | 451/533 |

FOREIGN PATENT DOCUMENTS

| JP | 2009-094326 | 4/2009 |
|---|---|---|
| JP | 2012-238732 | 12/2012 |

* cited by examiner

*Primary Examiner* — Duy T Nguyen
*Assistant Examiner* — Bo Bin Jang
(74) *Attorney, Agent, or Firm* — Greer Burns & Crain Ltd.

(57) ABSTRACT

A gettering property evaluating method for a wafer includes: a gettering layer forming step of polishing a back surface opposite to a front surface of a semiconductor wafer by use of a polishing wheel to form polishing marks on the back surface and to form a gettering layer inside the semiconductor wafer and beneath the polishing marks; an imaging step of imaging at least a unit region of the back surface formed with the polishing marks by imaging means; a counting step of counting the number of the polishing marks having a width of 10 to 500 nm present in the unit region imaged; and a comparing step of comparing the number of the polishing marks counted by the counting step with a predetermined value to determine whether or not the counted number is not less than the predetermined value.

3 Claims, 8 Drawing Sheets

Scratching material 0

Scratching material 2

Scratching material 6

Scratching material 10

METHOD OF EVALUATING GETTERING PROPERTY

BACKGROUND OF THE INVENTION

Field of the Invention

The present invention relates to a method of evaluating gettering property of a wafer.

Description of the Related Art

In recent years, for making devices smaller or for the like purposes, a wafer after formation of devices thereon (hereinafter, such a wafer will be referred to as "device wafer") has been processed to be thinner. However, when a device wafer is polished to reduce its thickness to or below 100 µm, for example, a gettering effect for trapping metallic elements, such as Cu, harmful to the devices is lowered, possibly leading to generation of malfunctions in the devices. For solving this problem, a gettering layer for trapping the metallic elements is formed in the device wafer (see, for example, Japanese Patent Laid-open No. 2009-094326). In this processing method, a device wafer is ground under predetermined conditions, whereby a gettering layer containing predetermined grinding strains is formed in the device wafer while maintaining the die strength of the device wafer.

In addition, as an evaluating method for the gettering property, there is a method wherein the back surface side of a device wafer is forcibly contaminated with a metallic element, thereafter the amount of atoms of the metallic element present on the front surface side is measured, and the gettering property is decided to be sufficient when the measured amount of the atoms of the metallic element is less than a predetermined detection limit (see, for example, Japanese Patent Laid-open No. 2012-238732).

SUMMARY OF THE INVENTION

However, the method of evaluating the gettering property by actually contaminating a device wafer with a metallic element is laborious, and makes it difficult to obtain acceptable device chips from the device wafer. In addition, this method involves the use of a device wafer for evaluation, and the gettering property cannot be evaluated with respect to device wafers that can become products.

Accordingly, it is an object of the present invention to provide an evaluating method by which gettering property can be easily evaluated in regard of device wafers that can become actual products.

In accordance with an aspect of the present invention, there is provided a gettering property evaluating method for evaluating gettering property of a semiconductor wafer having a plurality of devices formed on a front surface thereof. The gettering property evaluating method includes a gettering layer forming step of polishing a back surface opposite to the front surface of the semiconductor wafer by use of a polishing wheel to form polishing marks on the back surface and to form a gettering layer inside the semiconductor wafer and beneath the polishing marks, an imaging step of imaging at least a unit region of the back surface formed with the polishing marks by imaging means, a counting step of counting the number of the polishing marks having a width of 10 to 500 nm present in the unit region imaged, and a comparing step of comparing the number of the polishing marks counted by the counting step with a predetermined value to determine whether or not the counted number is not less than the predetermined number. In the comparing step, a state of the gettering layer is evaluated based on the counted number of the polishing marks.

Preferably, in the evaluating method, the area of the unit region is 10 µm², and the predetermined value is eight per 10 µm².

The present inventor found out that there is a correlation between the number of the polishing marks and the gettering property. In the present invention, gettering property of a semiconductor wafer can be evaluated by determining whether or not the number of polishing marks having a predetermined width formed by polishing the back surface of the semiconductor wafer is not less than a predetermined value. Therefore, device wafers that can become actual products can be an object of evaluation. In addition, since it is required only to count the number of polishing marks, the intended evaluation can be performed easily.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

1. First Embodiment (1) Gettering Layer Forming Step

Figure 1:
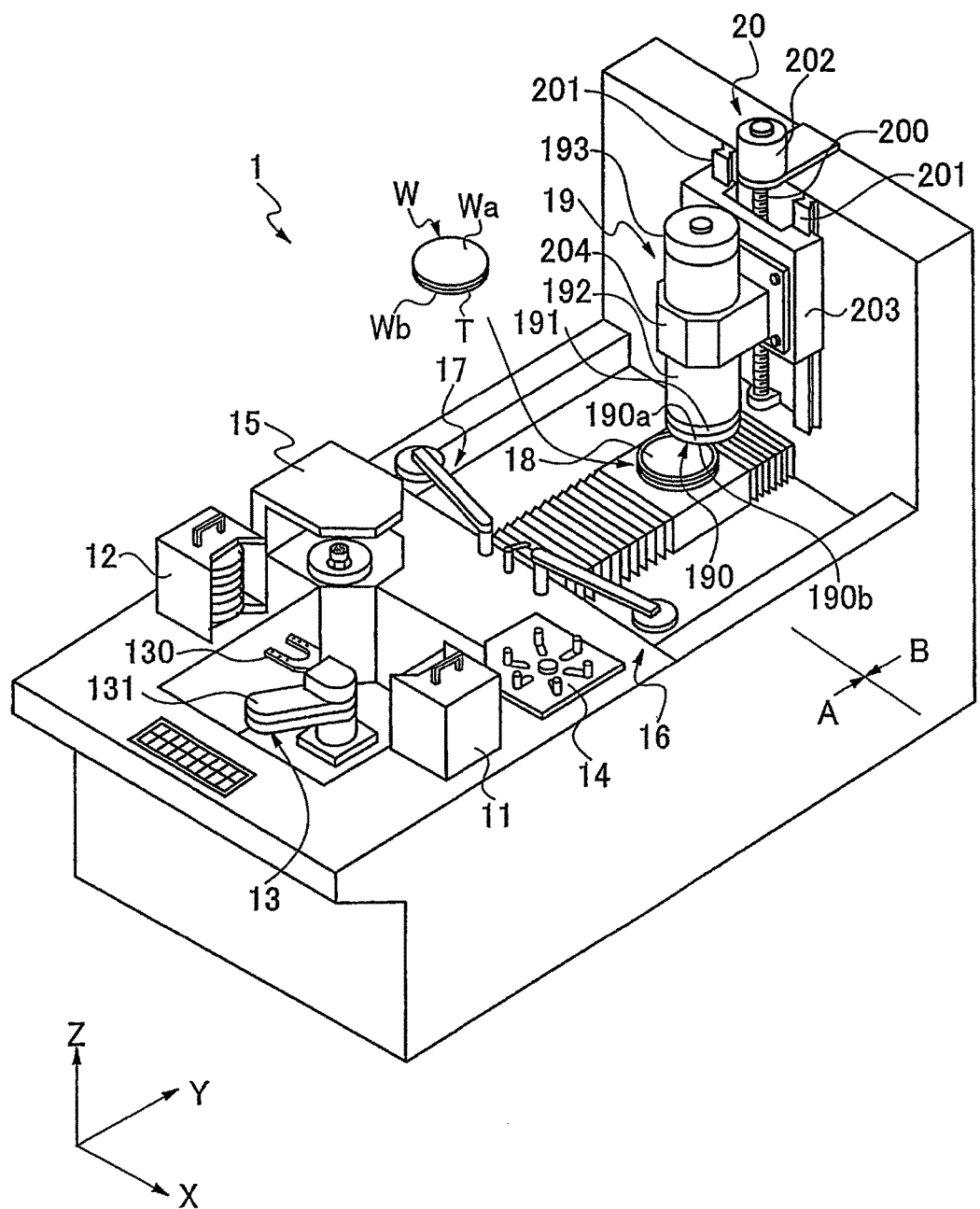
FIG. 1 is a perspective view of an example of a polishing apparatus.

In this step, a polishing apparatus 1 shown in FIG. 1, for example, is used. The polishing apparatus 1 is an apparatus for polishing a back surface Wa of a semiconductor wafer W held on a chuck table 18 by polishing means 19 to form a gettering layer. At a front portion of the polishing apparatus 1, a first wafer cassette 11 for accommodating semiconductor wafers W yet to be polished and a second wafer cassette 12 for accommodating polished semiconductor wafers W are mounted. In the vicinity of the first wafer cassette 11 and the second wafer cassette 12, there is disposed carrying-in/out means 13 for carrying out the semiconductor wafer W from the first wafer cassette 1 and for carrying in the semiconductor wafer W into the second wafer cassette 12.

The carrying-in/out means 13 includes a holding section 130 for holding the semiconductor wafer W and an arm section 131 for moving the holding section 130.

In a movable range of the holding section 130 constituting the carrying-in/out means 13, there are disposed center aligning means 14 for aligning the center position of the semiconductor wafer W carried out from the first wafer cassette 11, and cleaning means 15 for cleaning the polished semiconductor wafer W. In the vicinity of the center aligning means 14, there is disposed first carrying means 16 for carrying to the chuck table 18 the semiconductor wafer W the center position of which has been aligned to a predetermined position by the center aligning means 14. In addition, in the vicinity of the cleaning means 15, there is disposed second carrying means 17 for carrying the polished semiconductor wafer W from the chuck table 18 to the cleaning means 15. The chuck table 18 can be rotated and can be moved between an attachment/detachment region A and a processing region B.

The polishing means 19 includes a polishing wheel 190 having a rotational axis in the vertical direction, a mount 191 for supporting the polishing wheel 190, a spindle 192 connected to the mount 191, and a motor 193 for rotating the spindle 192. The polishing wheel 190 includes a base 190*a* and a polishing pad 190*b* firmly attached to a lower surface of the base 190*a*. The polishing pad 190*b* has abrasive grains contained in a pad made of a nonwoven fabric, polyurethane or the like, and is used for polishing in which a slurry is not used (dry polishing). The dry polishing may be performed after chemical mechanical polishing (CMP) processing. In addition, for example, a method may be adopted wherein polishing with the polishing pad containing the abrasive grains is conducted by supplying a basic or acidic polishing liquid and, thereafter, the supply of the polishing liquid is stopped and polishing with the polishing pad or a different polishing pad is conducted while supplying water, to thereby form a gettering layer. Note that the polishing liquid may or may not contain abrasive grains.

The polishing means 19 is liftably supported by polishing feeding means 20, and can be brought closer to or away from the chuck table 18. The polishing feeding means 20 includes a ball screw 200 having an axis in the vertical direction, guide rails 201 extending in parallel to the ball screw 200, a motor 202 for rotating the ball screw 200, a liftable member 203 provided therein with a nut for screw engagement with the ball screw 200 and having side portions in sliding contact with the guide rails 201, and a holder 204 which is fixed to the liftable member 203 and holds the polishing means 19. When the ball screw 200 is rotated by the motor 202, the liftable member 203 is moved up or down while being guided by the guide rails 201, and, attendant on this, the polishing means 19 is also moved up or down.

In this polishing apparatus 1, a protective tape T for protecting a plurality of devices formed on a front surface Wb of the semiconductor wafer W to be polished is adhered to the semiconductor wafer W, and the semiconductor wafer W with the protective tape T is accommodated in the first wafer cassette 11. The semiconductor wafer W with the protective tape T adhered thereto is carried out of the first wafer cassette 11 and carried to the center aligning means 14, by the carrying-in/out means 13. At the center aligning means 14, the center position of the semiconductor wafer W is aligned to a predetermined position, after which the semiconductor wafer W is carried by the first carrying means 16 to the chuck table 18 located in the attachment/detachment region A. At the chuck table 18, the semiconductor wafer W is held with the protective tape T side on the lower side, so that the back surface Wa of the semiconductor wafer W is exposed to the upper side.

Figure 2:
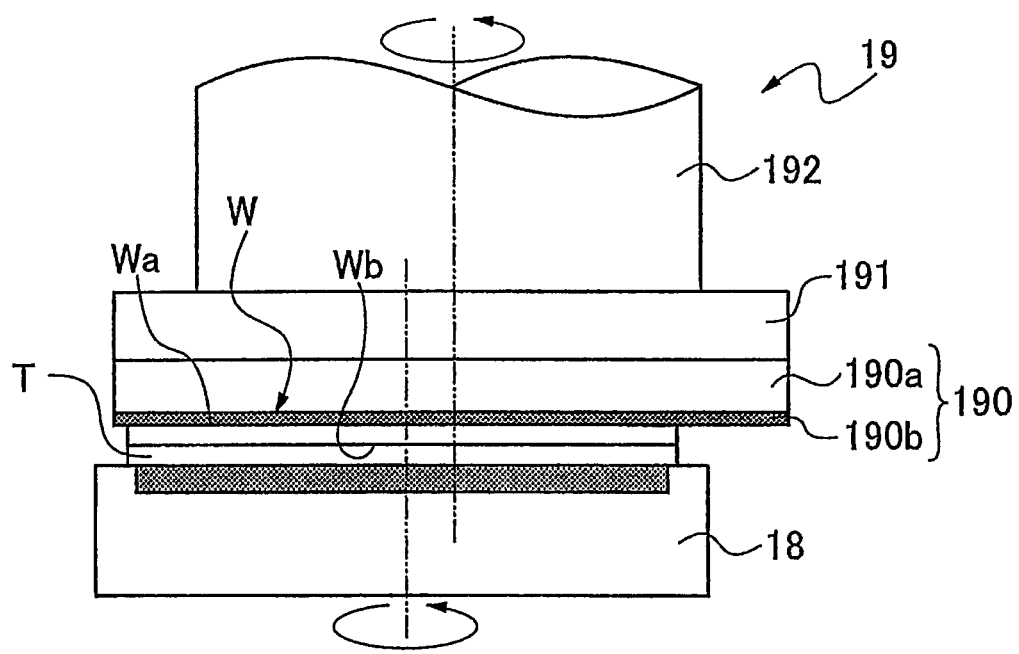
FIG. 2 is a front view showing a state in which a semiconductor wafer is polished.

Next, the chuck table 18 is moved into the processing region B, and the semiconductor wafer W held on the chuck table 18 is positioned under the polishing means 19. While the polishing wheel 190 is kept in rotation, downward polishing feeding of the polishing means 19 is conducted by the polishing feeding means 20, whereby the polishing pad 190*b* in rotation is brought into contact with the back surface Wa of the semiconductor wafer W, to polish the back surface Wa, as shown in FIG. 2. When the back surface Wa is polished in this way, polishing marks are formed on the back surface Wa. In addition, a gettering layer is formed beneath the polishing marks (on the front surface Wb side of the polishing marks). The gettering layer has a role of capturing metallic atoms present inside the semiconductor wafer W.

When the polishing of the back surface Wa is finished, the chuck table 18 is moved into the attachment/detachment region A shown in FIG. 1. Then, the semiconductor wafer W is carried by the second carrying means 17 to the cleaning means 15, and polishing dusts or swarfs adhering to the back surface Wa are removed by the cleaning means 15, after which the thus cleaned semiconductor wafer W is carried into the second wafer cassette 12 by the carrying-in/out means 13.

(2) Imaging Step

Figure 3:
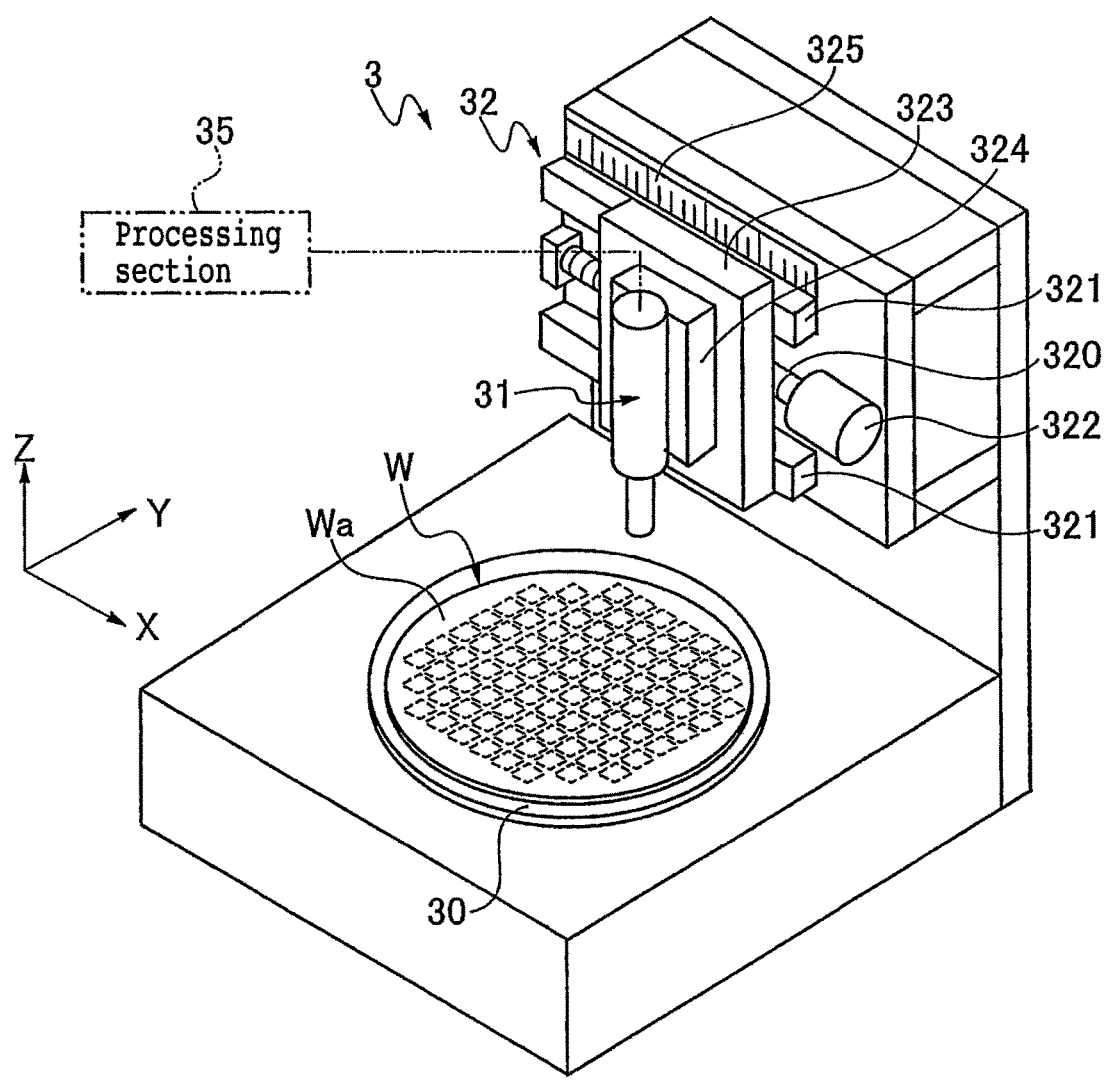
FIG. 3 is a perspective view of an example of a gettering property evaluating apparatus.

In this step, a gettering property evaluating apparatus 3 shown in FIG. 3, for example, is used. The gettering property evaluating apparatus 3 includes a holding table 30 for holding the polished semiconductor wafer W, imaging means 31 for imaging the back surface Wa of the semiconductor wafer W held by the holding table 30, and a feeding section 32 for moving the imaging means 31 in an X-axis direction. The holding table 30 has a holding surface for holding the semiconductor wafer W thereon, and can be rotated. Note that the holding table 30 may be movable in a Y-axis direction which is horizontal and orthogonal to the X-axis direction.

The feeding section 32 includes a ball screw 320 having an axis in the X-axis direction, guide rails 321 extending in parallel to the ball screw 320, a motor 322 for rotating the ball screw 320, a movable member 323 provided therein with a nut in screw engagement with the ball screw 320 and having side portions in sliding contact with the guide rails 321, and a bracket 324 which is fixed to the movable member 323 and holds the imaging means 31. When the ball screw 320 is rotated by the motor 322, the movable member 323 is moved in the X-axis direction while being guided by the guide rails 321, and, attendant on this, the imaging means 31 is also moved in the X-axis direction. In addition, a scale 325 is disposed in parallel to the guide rails 321, and the position of the imaging means 31 in the X-axis direction can be recognized owing to the scale 325.

Figure 4:
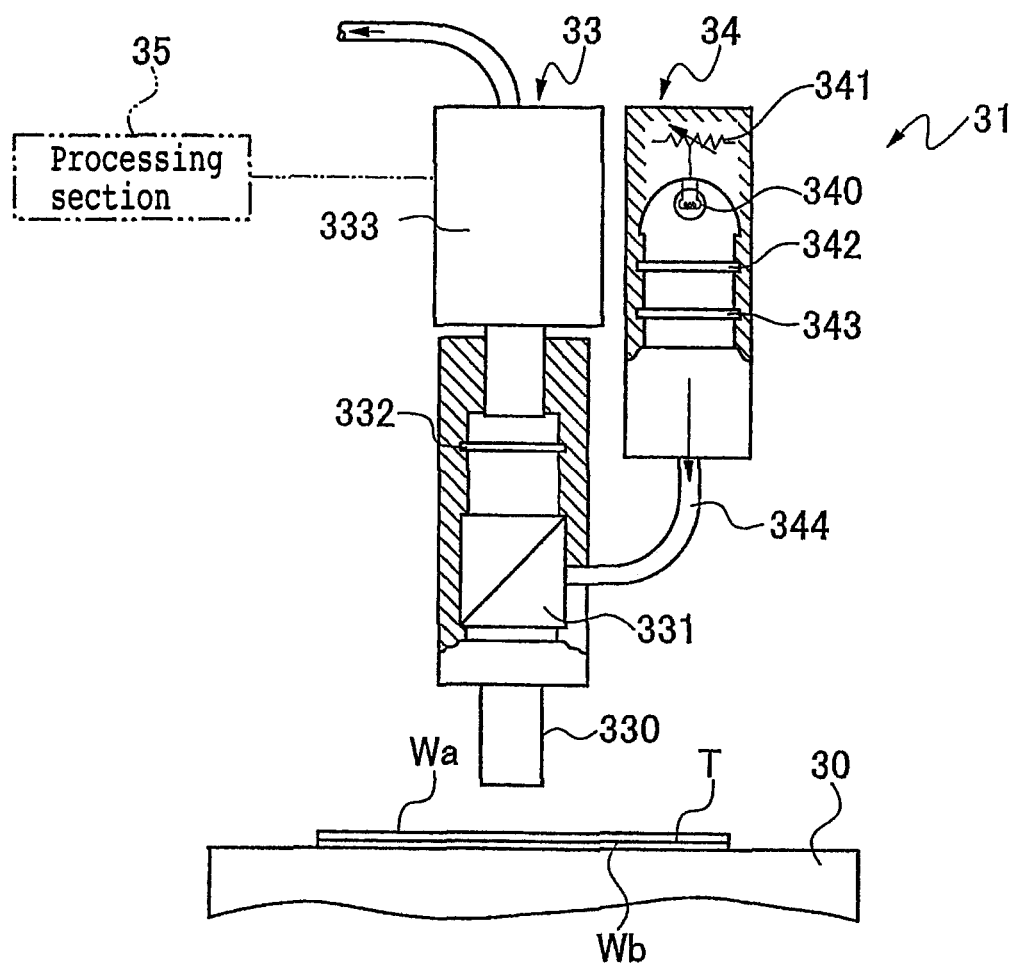
FIG. 4 is a sectional view of imaging means constituting the gettering property evaluating apparatus.

As illustrated in FIG. 4, the imaging means 31 includes an optical section 33 and an illuminating section 34. The illuminating section 34 is provided therein with a light emitting body 340 such as a halogen lamp, and the light emitting body 340 is connected to a power source through a dimmer 341. In addition, a heat ray absorbing filter 342 and a narrow-band filter 343 are disposed in a propagating direction of the light emitted from the light emitting body 340.

The optical section 33 has a configuration wherein an objective lens 330 located at the lowest portion, a half-mirror 331 located on the upper side of the objective lens 330, a narrow-band filter 332 located on the upper side of the half-mirror 331, and an imaging element 333 located on the upper side of the narrow-band filter 332 are arranged such that their optical axes coincide with one another. In addition, on a lateral side of the half-mirror 331, there is disposed a fiber 344 for guiding to the half-mirror 331 illuminating light emitted from the illuminating section 34. Note that a configuration may be adopted wherein light from the illuminating section 34 is directly incident on the half-mirror 331 without being guided through the fiber 344. Further, the light emitted from the illuminating section 34 may be directly cast on the semiconductor wafer W without being guided through the optical section 33. The imaging element 333 is connected with a processing section 35. The processing section 35 includes a central processing unit (CPU), a storage element such as a memory, etc., performs analysis based on image information obtained by the imaging element 333, and determines the gettering characteristic of the semiconductor wafer W.

Figure 5:
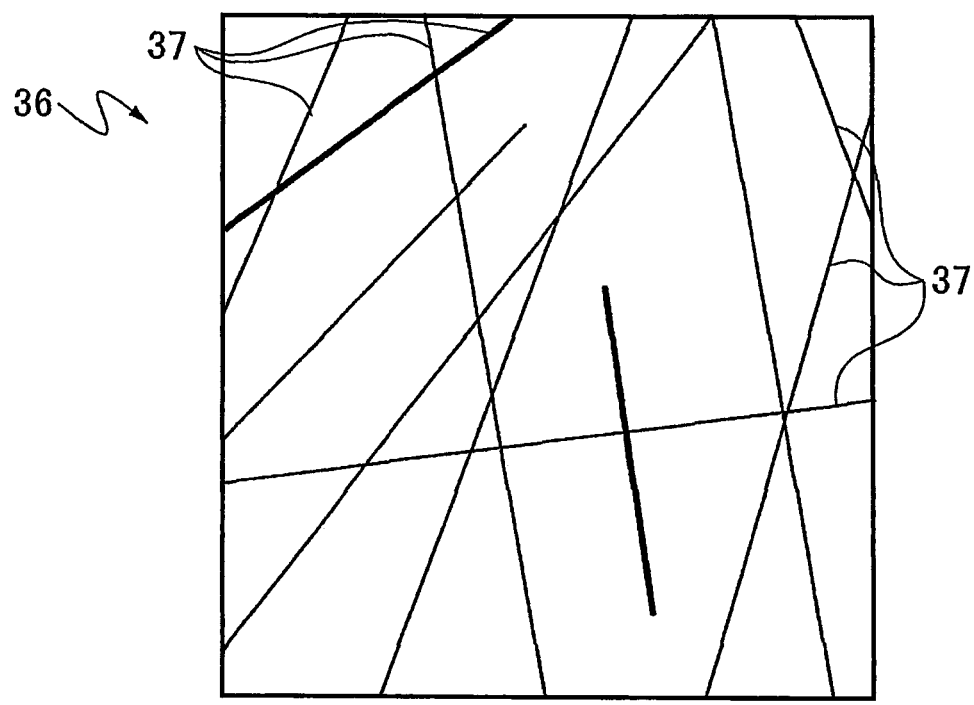
FIG. 5 is an image showing an example of polishing marks formed on a back surface of the semiconductor wafer.

As depicted in FIG. 3, in the gettering property evaluating apparatus 3, the polished semiconductor wafer W is held on the holding table 30, with its back surface Wa exposed. The imaging means 31 is fed in the X-axis direction under driving by the feeding section 32, the objective lens 330 shown in FIG. 4 is moved to a position over a position to be imaged of the semiconductor wafer W, and a predetermined position on the back surface Wa is imaged. An image formed by the imaging, for example, image information 36 depicted in FIG. 5 is sent to the processing section 35.

Such imaging may be performed at a plurality of arbitrary parts of the back surface Wa. For instance, three parts consisting of an outer peripheral part, an intermediate part between the outer peripheral part and a central part, and the central part, of the back surface Wa, are imaged while moving the imaging means 31 in the X-axis direction. Besides, different positions scattered along the circumferential direction of the back surface Wa may be imaged by a method in which the imaging means 31 is positioned at a fixed position and the imaging is conducted while rotating the holding table 30.

(3) Counting Step

In this step, the processing section 35 counts the number of polishing marks 37 present in a unit region of the back surface Wa, based on the image information 36 formed in the imaging step. Here, the unit region may be, for example, a region obtained by imaging once, or may be a region having a predetermined area of the image information obtained. The unit region is, for example, 10 $\mu m^2$.

The processing section 35 detects a pixel having color information different from that of a flat-formed part of the back surface Wa. When the pixel is detected, the number of pixels appearing in series in the case where a series of pixels having the same color information as that of the above-mentioned pixel appear is counted, and, when the number of the pixels appearing in series is not less than a predetermined number (for example, a number corresponding to a length of several micrometers to several millimeters), the pixels are decided to be pixels constituting a polishing mark. In addition, even if the number of the pixels appearing in series is less than the predetermined value, when pixels having the same color information are intermittently present on the same straight line or on the same locus and the total number of the pixels appearing on the straight line or the locus is not less than a predetermined value, it is similarly decided that a polishing mark is present. In this way, a polishing mark is detected.

Next, the processing section 35 counts the number of pixels having the same color information and being present in the direction orthogonal to the lengthwise direction of the polishing mark, to thereby calculate the length in the widthwise direction (namely, the width) of the polishing mark. When the width thus obtained is decided to be, for example, within a predetermined range, for example, in a range of 10 to 500 nm, the processing section 35 counts up that region on the memory which indicates the number of polishing marks. Here, the lower limit is provided for the width of the polishing mark, since too thin a polishing mark is considered not to produce a gettering effect. In addition, the upper limit is provided for the width of the polishing mark, since too thick a polishing mark is considered to lower die strength and to lower device quality.

When the detection of the polishing mark and the calculation of the width of the polishing mark conducted as above-mentioned is carried out for the whole part of the unit region, the number of polishing marks having a width within the predetermined range is determined, and the thus determined number is stored in the memory in the processing section 35. In an example illustrated in FIG. 5, eleven polishing marks 37 having a width in the predetermined range are detected. Note that the polishing marks which are continuous in a field of vision under observation may be counted as one polishing mark.

Note that when a plurality of parts are imaged in the imaging step, for example, the number of polishing marks in image information of the respective parts is counted, the average of the counted numbers is determined, and the average is stored in the memory in the processing section 35. Besides, whether or not the numbers of polishing marks counted in the respective parts are not less than a predetermined threshold value may be determined, and the numbers of polishing marks in the parts where polishing marks in a number of not less than the threshold value have been detected may be stored individually.

(4) Comparing Step

In this step, the number of polishing marks counted by the processing section 35 is compared with a predetermined value to determine whether or not the counted number is not less than the predetermined value. The predetermined value is preliminarily inputted into the memory in the processing section 35. For example, the predetermined value in the case where the unit region is 10 $\mu m^2$ is eight per 10 $\mu m^2$. Such a predetermined value is the number of polishing marks formed on a semiconductor wafer where the wafer is polished by the same polishing wheel as the polishing wheel 190 shown in FIGS. 1 and 2, the number of polishing marks being preliminarily verified to have a predetermined gettering property.

When it is found as a result of the comparison that the counted number of the polishing marks is not less than the predetermined value, it is decided that the gettering property is sufficient. For instance, in the example of FIG. 5, the number of polishing marks is eleven per 10 $\mu m^2$, and, therefore, it is decided that sufficient gettering property is present. Note that in the case where an average of a plurality of values is determined in the counting step, the average is compared with a predetermined value, and, when the average is not less than the predetermined value, it is decided that gettering property is sufficient.

Actual devices are not sufficient if they are only good in gettering characteristic; specifically, the actual devices are required also to have a predetermined die strength. In view of this, a device determined to be sufficient in gettering property in the comparing step is put to a test for determining whether or not the device has a predetermined die strength (for example, 1,000 MPa). After a wafer is divided into individual device chips, the die strength of each chip is calculated by, for example, the method described in Japanese Patent Laid-open No. 2012-238732, and chips having a die strength of not less than 1,000 MPa, for example, are decided to be acceptable.

As has been described above, gettering property can be evaluated by determining whether or not the number of polishing marks which are formed by polishing the back surface of a semiconductor wafer and which have a predetermined width is not less than a predetermined value, and, therefore, device wafers that can become actual products can be an object of evaluation. In addition, since it is only necessary to count the number of polishing marks, the intended evaluation can be performed easily.

Note that instead of the number of polishing marks, the ruggedness (arithmetic mean roughness) of grooves constituting the polishing marks can also be put to determination of whether or not it is not less than a predetermined value, so as thereby to decide the gettering property. In this case, the predetermined value of the arithmetic mean roughness is the value of arithmetic mean roughness which is measured from the back surface of a semiconductor wafer where the wafer is polished by the same polishing wheel as the polishing wheel 190 shown in FIGS. 1 and 2 and which is preliminarily verified to have a predetermined gettering property.

2. Second Embodiment

Figure 6:
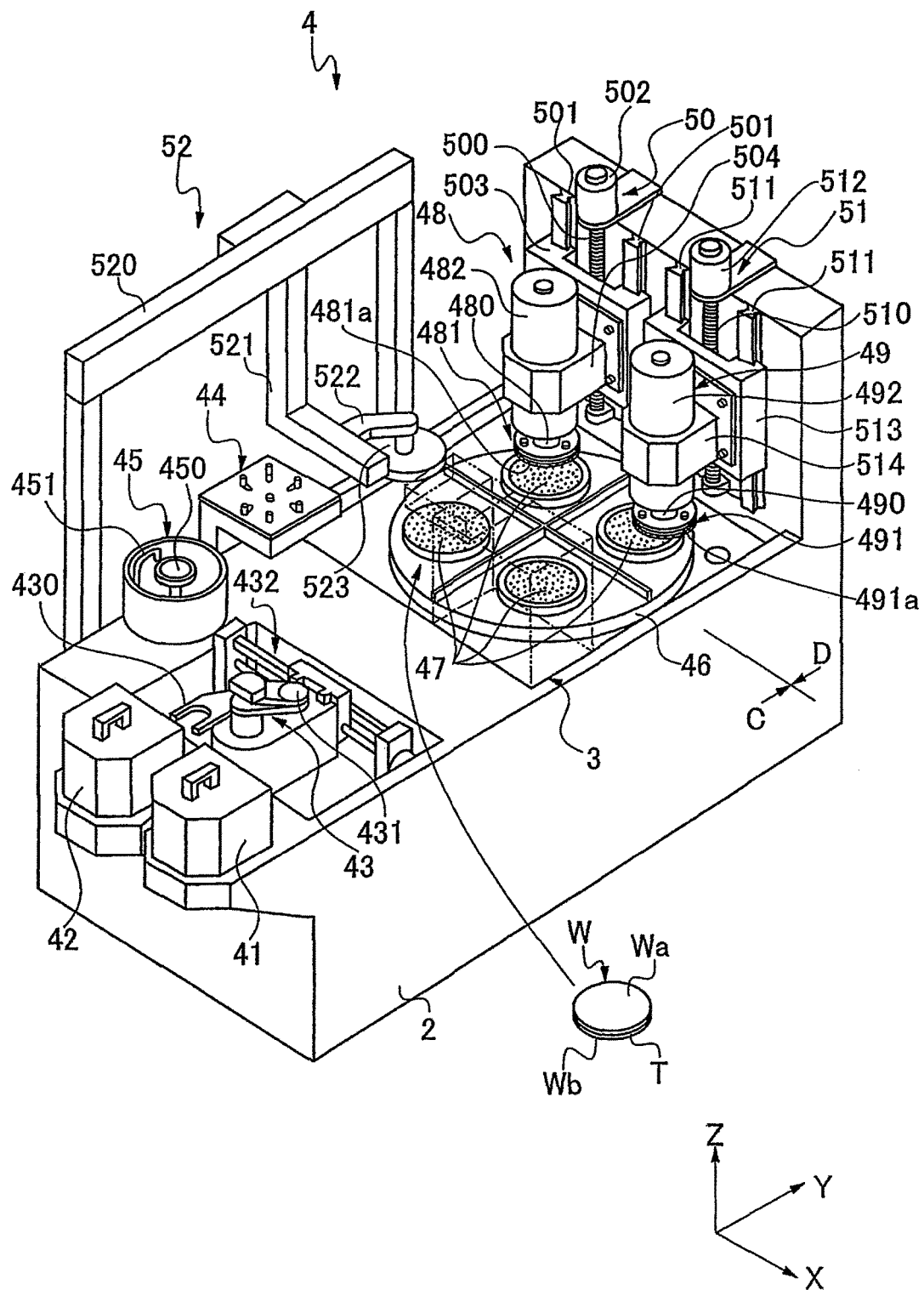
FIG. 6 is a perspective view of an example of a processing apparatus for grinding and polishing the semiconductor wafer.

A processing apparatus 4 depicted in FIG. 6 is an apparatus which has a function of grinding the back surface of a semiconductor wafer, a function of polishing the ground back surface of the semiconductor wafer, and a function of evaluating the gettering property of the polished semiconductor wafer. At a front portion of the processing apparatus 4, a first wafer cassette 41 for accommodating semiconductor wafers yet to be polished and a second wafer cassette 42 for accommodating polished semiconductor wafers are mounted.

At a position facing the first wafer cassette 41 and the second wafer cassette 42, there is disposed carrying-in/out means 43 by which the semiconductor wafers yet to be polished are carried out from the first wafer cassette 41 and the polished semiconductor wafers are carried into the second wafer cassette 42. The carrying-in/out means 43 includes a holding section 430 for holding the semiconductor wafer, an arm section 431 for moving the holding section 430 to a desired position, and a feeding section 432 for moving the holding section 430 and the arm section 431 in an X-axis direction.

In a movable region of the holding section 430 constituting the carrying-in/out means 43, there is disposed a temporary placing table 44 on which the semiconductor wafer carried out from the first wafer cassette 41 is placed and the center of the semiconductor wafer is aligned to a predetermined position. In the vicinity of the carrying-in/out means 43, there is disposed cleaning means 45 for cleaning the polished semiconductor wafer. The cleaning means 45 includes a spinner table 450 rotated while holding the semiconductor wafer, and a nozzle 451 for jetting cleaning water to the semiconductor wafer.

A turntable 46 is disposed on the rear side of the carrying-in/out means 43, and four chuck tables 47 are supported by the turntable 46 such that they can be rotated about their respective axes. The four chuck tables 47 are revolved around the center of the turntable 46 by the rotation of the turntable 46, and can be moved between a processing region D and an attachment/detachment region C. Grinding means 48 for grinding the back surface of the semiconductor wafer and polishing means 49 for polishing the back surface of the semiconductor wafer having been ground by the grinding means 48 are disposed in the processing region D. The grinding means 48 is supported by grinding feeding means 50 in a liftable manner, and the polishing means 49 is supported by polishing feeding means 51 in a liftable manner.

The grinding means 48 includes a spindle 480 having a rotational axis in the vertical direction, a grinding wheel 481 connected to the spindle 480, and a motor 482 for rotating the spindle 480. The grinding wheel 481 is provided with a grindstone 481a at a lower portion thereof. The grinding feeding means 50 includes a ball screw 500 having an axis in the vertical direction, guide rails 501 extending in parallel to the ball screw 500, a motor 502 for rotating the ball screw 500, a liftable member 503 which is provided therein with a nut for screw engagement with the ball screw 500 and has side portions in sliding contact with the guide rails 501, and a holder 504 which is fixed to the liftable member 503 and holds the grinding means 48. When the motor 502 rotates the ball screw 500, the liftable member 503 is moved up or down while being guided by the guide rails 501, and, attendant on this, the grinding means 48 is also moved up or down.

The polishing means 49 includes a spindle 490 having a rotational axis in the vertical direction, a polishing wheel 491 connected to the spindle 490, and a motor 492 for rotating the spindle 490. The polishing wheel 491 is provided with a polishing pad 491a at a lower portion thereof. The polishing feeding means 51 includes a ball screw 510 having an axis in the vertical direction, guide rails 511 extending in parallel to the ball screw 510, a motor 512 for rotating the ball screw 510, a liftable member 513 which is provided therein with a nut for screw engagement with the ball screw 510 and has side portions in sliding contact with the guide rails 511, and a holder 514 which is fixed to the liftable member 513 and holds the polishing means 49. When the motor 512 rotates the ball screw 510, the liftable member 513 is moved up or down while being guided by the guide rails 511, and, attendant on this, the polishing means 49 is also moved up or down.

In the processing apparatus 4, carrying means 52 is disposed by which the semiconductor wafer W is carried between the chuck table 47 located in the attachment/detachment region C and the temporary placing table 44 and the cleaning means 45. The carrying means 52 includes a guide bar 520 which is arranged in a Y-axis direction and both ends of which are located in respective one of the attachment/detachment region C and the processing region D, a first arm 521 moved along the guide bar 520, a second arm 522 moved in the X-axis direction in relation to the first arm 521, and a holding section 523 moved up and down in relation to the second arm 522.

Over the chuck table 47 located in the attachment/detachment region C, there is disposed a gettering property evaluating apparatus 3 (omitted in the drawing) for evaluating the gettering property of the polished semiconductor wafer. The configuration of the gettering property evaluating apparatus 3 is as illustrated in FIGS. 3 and 4.

In the processing apparatus 4 depicted in FIG. 6, a protective tape T for protecting a plurality of devices formed on a front surface Wb of the semiconductor wafer W as an object to be processed is adhered to the front surface Wb, and the semiconductor wafer W with the protective tape T is accommodated in the first wafer cassette 41. The semiconductor wafer W with the protective tape T adhered thereto is carried out from the first wafer cassette 41 and carried to the center aligning means 44, by the carrying-in/out means 43. At the center aligning means 44, the center position of the semiconductor wafer W is aligned to a predetermined position, after which the semiconductor wafer W is carried to the chuck table 47 located in the attachment/detachment region C by the carrying means 52. At the chuck table 47, the semiconductor wafer W is held with the protective tape T side on the lower side, so that a back surface Wa of the semiconductor wafer W is exposed to the upper side.

Next, the chuck table 47 is moved to a position under the grinding means 48 in the processing region D, by the rotation of the turntable 46. The chuck table 47 is rotated on its own axis, and, at the same time, the grinding feeding means 50 puts the grinding means 48 into downward grinding feed with the grinding wheel 481 being rotated, and the grindstone 481a being rotated is brought into contact with the back surface Wa of the semiconductor wafer W, whereby the back surface Wa is ground.

Subsequently, the turntable 46 is rotated clockwise, whereby the ground semiconductor wafer W is moved to a position under the polishing means 49. The chuck table 47 is rotated, and, at the same time, the polishing feeding means 51 puts the polishing means 49 into polishing feed with the polishing wheel 491 being rotated, and the polishing pad 491a being rotated is brought into contact with the back surface Wa of the semiconductor wafer W, whereby the back surface Wa is polished. When the back surface Wa is thus ground and polished, polishing marks are formed on the back surface Wa. At a portion beneath the polishing marks, namely, at a portion which is inside of the semiconductor wafer W and is on the front surface Wb side relative to the back surface Wa, a gettering layer is formed (gettering layer forming step).

Next, the turntable 46 is rotated clockwise, whereby the polished semiconductor wafer W is moved into the vicinity of the cleaning means 45 in the attachment/detachment region C. Then, the polished semiconductor wafer W is carried to the cleaning means 45 by the carrying means 52, and the polished back surface Wa is cleaned.

The semiconductor wafer W with its back surface Wa thus cleaned is carried to the chuck table 47 by the carrying means 52. Then, the turntable 46 is rotated clockwise, whereby the semiconductor wafer W is moved to a position under the gettering property evaluating apparatus 3 in the attachment/detachment region C. Here, an imaging step, a counting step and a comparing step are performed like in the first embodiment, to decide whether or not the polished semiconductor wafer W has a sufficient gettering property.

Note that in the case where the gettering property of the semiconductor wafer W is decided to be insufficient by the gettering property evaluating apparatus 3, the turntable 46 may further be rotated counterclockwise to move the semiconductor wafer W again to the position under the grinding means 48, grinding and polishing of the back surface Wa may again be performed, and it may be tested by the gettering property evaluating apparatus 3 whether or not the gettering property of the semiconductor wafer W has been enhanced.

3. Third Embodiment

Figure 7:
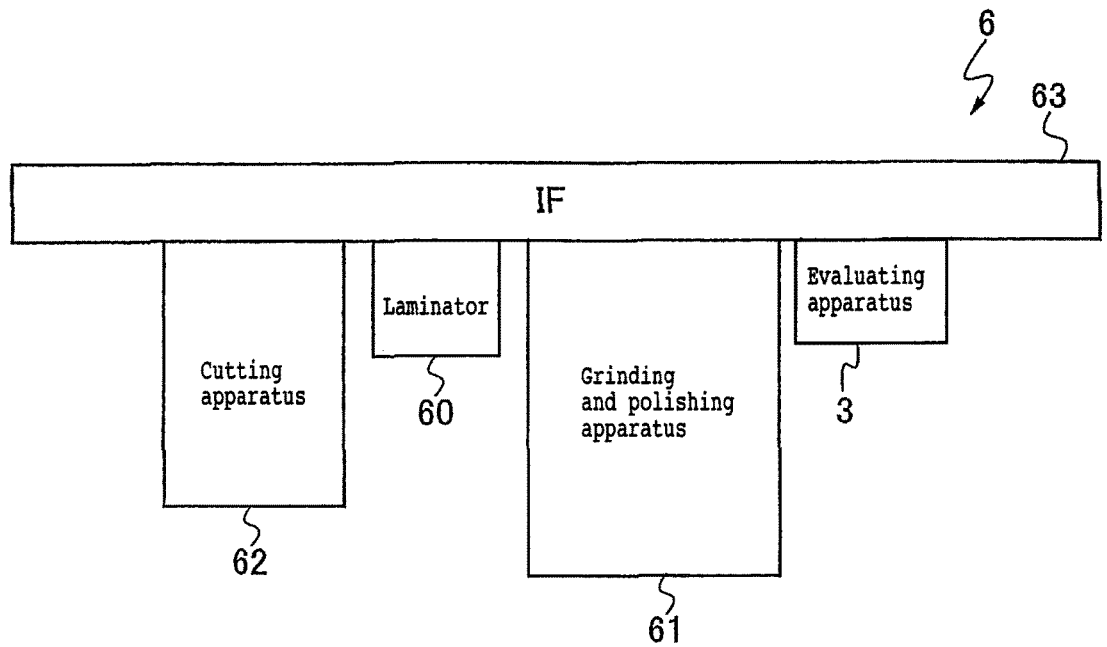
FIG. 7 is a front view of an example of an in-line processing apparatus.

An in-line processing apparatus 6 shown in FIG. 7 has a configuration wherein a laminator 60 for adhering a protective tape T for device protection to the front surface Wb of the semiconductor wafer W shown in FIG. 1 and the like, a grinding and polishing apparatus 61 for grinding and polishing of the back surface Wa of the semiconductor wafer Wa, a gettering property evaluating apparatus 3 for evaluating the gettering property of the polished semiconductor wafer W, and a cutting apparatus 62 for cutting the polished semiconductor wafer W are connected through an interface 63. The interface 63 is provided with carrying mechanisms for carrying the semiconductor wafer W between the apparatuses.

In this in-line processing apparatus 6, first, the protective tape T is adhered to the front surface Wb of the semiconductor wafer W at the laminator 60. Then, the semiconductor wafer W with the protective tape T adhered to the front surface Wb thereof is carried to the grinding and polishing apparatus 61, where the back surface Wa of the semiconductor wafer W is ground and polished.

Next, the semiconductor wafer W with its back surface Wa having been ground and polished is carried to the gettering property evaluating apparatus 3, and the gettering property of the semiconductor wafer W is evaluated. In the case where the gettering property is determined to be insufficient, grinding and polishing of the back surface Wa are again performed. In the case of performing the grinding and polishing again, the processing may be performed under the same conditions as in the preceding processing, without changing the processing conditions such as rotational speeds of the grindstone and the polishing pad and the pressing load. However, in the case where the gettering property is not improved even after the re-processing or where an improvement is achieved but the gettering property is still insufficient, the processing conditions may be changed in such a manner that a sufficient gettering property will be obtained. On the other hand, in the case where the gettering property is decided to be sufficient, the semiconductor wafer W is carried to the cutting apparatus 62, and is cut in crossing directions to be thereby divided into individual chips.

4. Fourth Embodiment

Figure 8:
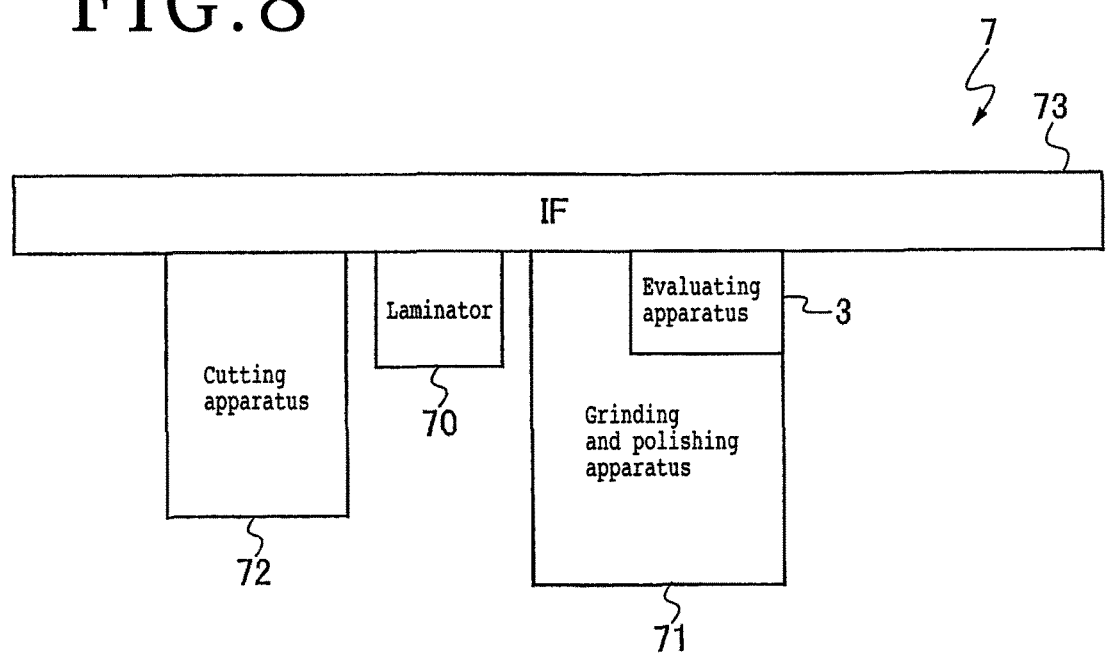
FIG. 8 is a front view of another example of the in-line processing apparatus.

An in-line processing apparatus 7 depicted in FIG. 8 has a configuration wherein a laminator 70 for adhering a protective tape T for device protection to the front surface Wb of the semiconductor wafer W, a grinding and polishing apparatus 71 for grinding and polishing of the back surface Wa of the semiconductor wafer W, and a cutting apparatus 72 for cutting the polished semiconductor wafer W are connected through an interface 73. A gettering property evaluating apparatus 3 for evaluating the gettering property of the polished semiconductor wafer W is disposed inside the grinding and polishing apparatus 71. The interface 73 is provided with carrying mechanisms for carrying the semiconductor wafer W between the apparatuses.

In this in-line processing apparatus 7, also, first, the protective tape T is adhered to the front surface Wb of the semiconductor wafer W. Then, the semiconductor wafer W with the protective tape T adhered to the front surface Wb thereof is carried to the grinding and polishing apparatus 71, where the back surface Wa of the semiconductor wafer W is ground and polished.

Next, the semiconductor wafer W with its back surface Wa having been ground and polished is carried to the gettering property evaluating apparatus 3 inside the grinding and polishing apparatus 71, where the gettering property of the semiconductor wafer W is evaluated. In the case where the gettering property is determined to be insufficient, the grinding and polishing of the back surface Wa are performed again. On the other hand, in the case where the gettering property is decided to be sufficient, the semiconductor wafer W is carried to the cutting apparatus 72, and is cut in crossing directions, to be thereby divided into individual chips.

As has been described above, in the present invention, based on the finding of the correlation between the number of polishing marks and the gettering property, the number of polishing marks present after polishing of the back surface Wa of the semiconductor wafer W is counted, and, when the number of the polishing marks is not less than a predetermined number, the gettering property of the semiconductor wafer W is decided to be sufficient. Therefore, device wafers that can become actual products can be an object of evaluation. In addition, since it is required only to count the number of the polishing marks, the intended evaluation can be performed easily.

In the first and third embodiments above, the gettering property evaluating apparatus is provided separately from the polishing apparatus, whereas in the second and fourth embodiments above, the gettering property evaluating apparatus is provided inside the polishing apparatus. Accordingly, the present invention includes the gettering property evaluating apparatus and the polishing apparatus as follows.

[1]

A gettering property evaluating apparatus for evaluating gettering property of a semiconductor wafer, including:

a holding table for holding the semiconductor wafer in a state in which a polished back surface of the semiconductor wafer is exposed;

imaging means for imaging the back surface of the semiconductor wafer held on the holding table; and a processing section which counts the number of polishing marks having a predetermined width formed on the back surface based on an image formed by the imaging means, and decides the gettering property of the semiconductor wafer based on whether or not the counted number of the polishing marks is not less than a predetermined value.

According to the gettering property evaluating apparatus as just-mentioned, the number of polishing marks formed on the back surface of the semiconductor wafer can be counted efficiently. In the gettering property evaluating apparatus, the holding table may be rotatable, and the imaging means may be movable in a horizontal direction.

[2]

A polishing apparatus for polishing a back surface of a semiconductor wafer, including:

a chuck table for holding the semiconductor wafer;

polishing means for polishing the back surface of the semiconductor wafer held by the chuck table; and a gettering property evaluating apparatus which images the back surface polished by the polishing means, counts the number of polishing marks having a predetermined width, and evaluates gettering property of the semiconductor wafer based on whether or not the counted number of the polishing marks is not less than a predetermined value.

According to the polishing apparatus as just-mentioned, operations from polishing of the back surface of the semiconductor wafer to evaluation of gettering property can be efficiently carried out by one apparatus.

In addition, where either of the in-line processing apparatuses 6 and 7 shown in FIGS. 7 and 8, for example, is used, it is possible to impart a sufficient gettering property to a semiconductor wafer by polishing the back surface of the semiconductor wafer, and thereafter to divide the semiconductor wafer, thereby producing semiconductor devices having a sufficient gettering property. Accordingly, the present invention includes a method of producing a semiconductor device as follows.

[3]

A method of producing a semiconductor device by polishing a back surface of a semiconductor wafer and dividing the semiconductor wafer having the polished back surface, the method including:

a polishing step of polishing the back surface of the semiconductor wafer;

an evaluating step of imaging the back surface of the semiconductor wafer, counting the number of polishing marks having a predetermined width, and evaluating gettering property of the semiconductor wafer based on whether or not the counted number of the polished marks is not less than a predetermined value; and a dividing step of dividing the semiconductor wafer of which the gettering property is decided to be sufficient in the evaluating step into individual semiconductor devices.

According to the method of producing a semiconductor device as just-mentioned, the semiconductor wafer whose gettering property has been decided to be sufficient is divided into semiconductor devices. Therefore, production of semiconductor devices with an insufficient gettering property can be prevented, and the yield can be enhanced.

Note that while the semiconductor wafer is divided by use of the cutting apparatus in the in-line processing apparatuses 6 and 7 shown in FIGS. 7 and 8, a laser processing apparatus, a plasma etching apparatus and the like can also be used in place of the cutting apparatus.

In addition, in this method of producing a semiconductor device, the in-line processing apparatus may not necessarily be used; for example, the polishing apparatus and the gettering property evaluating apparatus and the dividing apparatus such as the cutting apparatus may be present separately from each other.

Furthermore, in the present invention, by counting the number of polishing marks formed on the back surface of the semiconductor wafer, it is possible to evaluate whether or not the polishing wheel can impart a desired gettering characteristic to the semiconductor wafer. Accordingly, the present invention includes a method of evaluating a polishing wheel as follows.

[4]

A method of evaluating a polishing pad for polishing a back surface of a semiconductor wafer, the method including:

a polishing step of bringing the polishing pad into contact with the back surface of the semiconductor wafer and pressing the polishing pad against the back surface to polish the back surface;

a deciding step of imaging the polished back surface, counting the number of polishing marks having a predetermined width, and deciding whether or not the counted number of the polishing marks is not less than a predetermined value; and an evaluating step of evaluating that the polishing pad has a sufficient gettering imparting capability when it is decided in the deciding step that the number of the polishing marks is not less than the predetermined value.

According to the method of evaluating a polishing pad as just-mentioned, whether or not the polishing pad has a desired gettering imparting capability can be decided based on whether or not the counted number of the polishing marks is not less than a predetermined value. Therefore, polishing pad conditions (the kind, particle diameter and number of abrasive grains, etc.) for imparting a desired gettering property to the semiconductor wafer can be determined. In addition, in the case where the gettering imparting capability is lowered due to abrasion of the polishing pad or the like, the lowering in the gettering imparting capability can be detected, and, therefore, production of semiconductor devices with an insufficient gettering property can be prevented.

Example 1

By use of a plurality of kinds of polishing pads differing in the amount of abrasive grains contained in the pad, the back surfaces of semiconductor wafers (bare wafers) were polished, and the polished back surfaces of the semiconductor wafers were imaged by use of an atomic force microscope (AFM). Traces of the respective images thus obtained are shown in FIGS. 9A to 9D. The size of each of the images in FIGS. 9A to 9D is 15×15 mm. The scratching materials in FIGS. 9A to 9D are polishing pads, and the numerical values in the scratching material 0, scratching material 2, scratching material 6, and scratching material 10 indicate the proportions of the amount of the abrasive grains contained in the pads. Here, the polishing pads used contained fine abrasive grains of green carborundum, alumina or the like having an average particle diameter of 1 µm and fine super-abrasive grains of diamond or cBN, wherein an amount of 0.5% by weight was used as a reference amount, and the scratching material 2 contained two times the reference amount, the scratching material 6 contained six times the reference amount, and the scratching material 10 contained ten times the reference amount of abrasive grains.

Figure 9A:
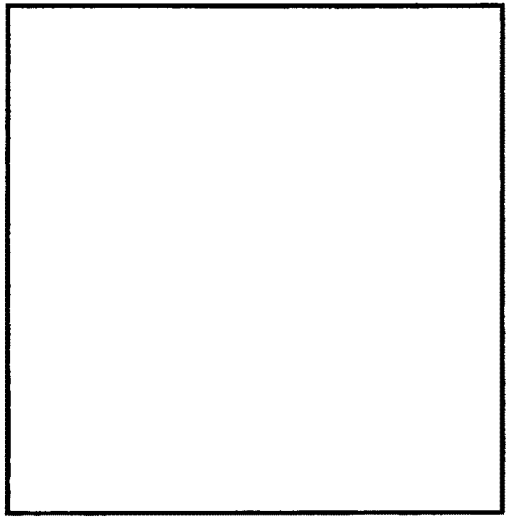
FIGS. 9A to 9D are plan views showing the states of back surfaces of semiconductor wafers in Example.
Figure 9B:
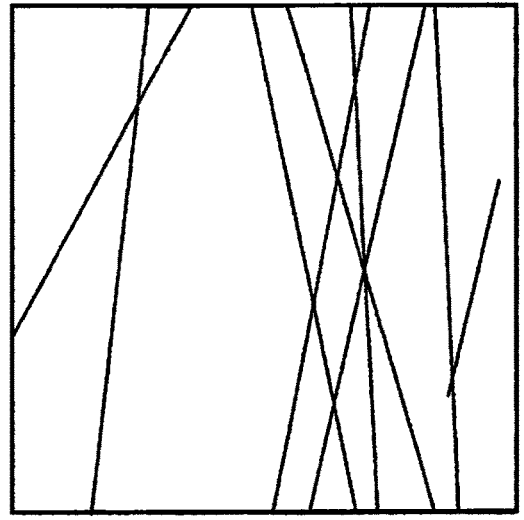
Figure 9C:
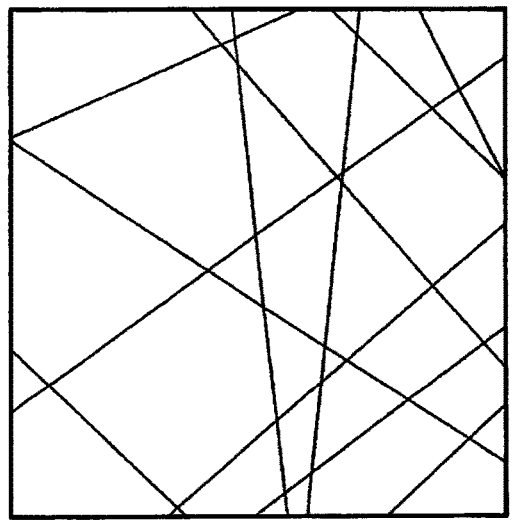
Figure 9D:
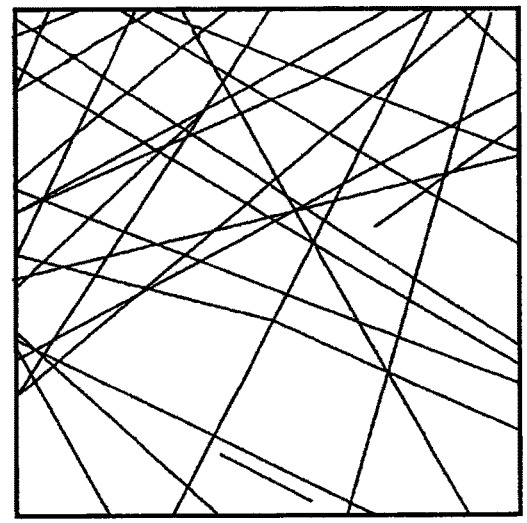

Shown in FIG. 9A is the state of the back surface of the semiconductor wafer in the case of polishing by use of the scratching material 0, namely, a polishing pad containing no abrasive grains in the pad; in this case, no polishing mark was detected. Shown in FIG. 9B is the state of the back surface of the semiconductor wafer in the case of polishing by use of the scratching material 2, namely, a polishing pad containing abrasive grains in an amount of 20% of that of the scratching material 10; in this case, a sufficient number of polishing marks were confirmed. Shown in FIG. 9C is the state of the back surface of the semiconductor wafer in the case of polishing by use of the scratching material 6, namely, a polishing pad containing abrasive grains in an amount of 60% of that of the scratching material 10; in this case, a sufficient number of polishing marks were confirmed. Shown in FIG. 9D is the state of the back surface of the semiconductor wafer in the case of polishing by use of the scratching material 10; in this case, a sufficient number of polishing marks were confirmed. In addition, from the results shown in FIGS. 9A to 9D, it was confirmed that the number of polishing marks increases as the amount of abrasive grains contained in the polishing pad used increases.

For the semiconductor wafers corresponding to FIGS. 9A to 9D, a copper sulfate solution was applied to the polished surface, and the amount of copper atoms at the wafer surface opposite to the polished surface was measured by a total reflex x-ray fluorescence (TXRF) analyzer. In such a measurement, in the case where copper atoms are detected at the front surface of the semiconductor wafer, it can be decided that the copper atoms have diffused into the inside of the semiconductor wafer and that the gettering effect is absent or insufficient. On the other hand, in the case where copper atoms are not detected at the front surface of the semiconductor wafer, it can be decided that the copper atoms are trapped on the back surface side and that a sufficient gettering effect is present. Note that a threshold value (detection limit) for decision whether or not copper atoms are detected was set at $0.5 \times E10$ atoms/cm$^2$.

When measurement of copper atoms by the above-mentioned method was conducted, the semiconductor wafer shown in FIG. 9A showed a copper atom amount of not less than the detection limit. Thus, it was confirmed that in the case where a polishing pad containing no abrasive grains is used to polish a semiconductor wafer, the semiconductor wafer has no gettering effect or has an insufficient gettering effect.

On the other hand, the semiconductor wafers shown in FIGS. 9B to 9D showed copper atom amounts of not more than the detection limit. Thus, it was confirmed that in the case of polishing by use of each of the scratching materials 2, 6 and 10, a sufficient gettering effect is obtained. In addition, it was also confirmed that the amount of copper atoms detected is smaller as the number of the polishing marks is larger. Therefore, it was confirmed that there is a correlation between the number of polishing marks and the gettering characteristic. Accordingly, it was also confirmed that the gettering effect obtained is higher as the amount of the abrasive grains contained in the polishing pad used is larger.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A gettering property evaluating method for evaluating gettering property of a semiconductor wafer having a plurality of devices formed on a front surface thereof, the gettering property evaluating method comprising:
    a gettering layer forming step of polishing a back surface opposite to the front surface of the semiconductor wafer by use of a polishing wheel to form polishing marks on the back surface and to form a gettering layer inside the semiconductor wafer and beneath the polishing marks;
    an imaging step of imaging at least a unit region of the back surface formed with the polishing marks by imaging means;
    a counting step of counting the number of the polishing marks having a width of 10 to 500 nm present in the unit region imaged; and
    a comparing step of comparing the number of the polishing marks counted by the counting step with a predetermined value to determine whether or not the counted number is not less than the predetermined value,
    wherein in the comparing step a state of the gettering layer is evaluated based on the counted number of the polishing marks.

2. The gettering property evaluating method according to claim 1, wherein the area of the unit region is 10 pmt, and the predetermined value is eight per 10 µm$^2$.

3. A gettering property evaluating method for evaluating gettering property of a semiconductor wafer having a plurality of devices formed on a front surface thereof, the gettering property evaluating method comprising:
    a gettering layer forming step of polishing a back surface opposite to the front surface of the semiconductor wafer by use of a polishing wheel to form polishing marks on the back surface and to form a gettering layer inside the semiconductor wafer and beneath the polishing marks;

an imaging step of imaging at least a unit region of the back surface formed with the polishing marks by imaging means;

a counting step of counting the number of the polishing marks having a width of 10 to 500 nm present in the unit region imaged; and a comparing step of comparing the number of the polishing marks counted by the counting step with a predetermined value to determine whether or not the counted number is not less than the predetermined value, wherein in the comparing step a state of the gettering layer is evaluated based on the counted number of the polishing marks, wherein the number of the polishing marks is counted by detecting a selected pixel having color information different from that of a flat formed part of the back surface, and when the selected pixel is detected, a number of other pixels appearing in series in the case where a series of other pixels have the same color information as that of the selected pixel is counted, and when the number of the other pixels appearing in series is not less than a predetermined number, the selected pixel and the other pixels are decided to constitute a polishing mark.

* * * * *